(12) United States Patent
Chiu et al.

(10) Patent No.: US 9,853,145 B1
(45) Date of Patent: Dec. 26, 2017

(54) HIGH-VOLTAGE SEMICONDUCTOR DEVICE AND METHOD OF MANUFACTURING THE SAME

(71) Applicant: Vanguard International Semiconductor Corporation, Hsinchu (TW)

(72) Inventors: Chien-Wei Chiu, Beigang Township (TW); Ching-Jong Chen, Magong (TW); Fan Ho, New Taipei (TW); Chien-Hsien Song, Kaohsiung (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 14 days.

(21) Appl. No.: 15/285,238

(22) Filed: Oct. 4, 2016

(51) Int. Cl.
| | |
|---|---|
| *H01L 29/76* | (2006.01) |
| *H01L 29/78* | (2006.01) |
| *H01L 23/528* | (2006.01) |
| *H01L 23/522* | (2006.01) |
| *H01L 29/06* | (2006.01) |
| *H01L 29/66* | (2006.01) |
| *H01L 29/49* | (2006.01) |
| *H01L 29/40* | (2006.01) |
| *H01L 21/768* | (2006.01) |

(52) U.S. Cl.
CPC .... *H01L 29/7816* (2013.01); *H01L 21/76877* (2013.01); *H01L 23/5226* (2013.01); *H01L 23/5283* (2013.01); *H01L 29/0649* (2013.01); *H01L 29/401* (2013.01); *H01L 29/4916* (2013.01); *H01L 29/66681* (2013.01)

(58) Field of Classification Search
CPC ............. H01L 29/7816–29/7826; H01L 29/66681–29/66704; H01L 29/401–29/407; H01L 29/0649–29/0653
USPC .................................................. 257/401, 374
See application file for complete search history.

(56) References Cited

U.S. PATENT DOCUMENTS

| | | | |
|---|---|---|---|
| 8,680,615 B2* | 3/2014 | Mitra | H01L 29/7835 257/335 |
| 8,836,026 B2* | 9/2014 | Roehrer | H01L 29/0653 257/337 |

(Continued)

FOREIGN PATENT DOCUMENTS

| | | |
|---|---|---|
| CN | 103296063 A | 9/2013 |
| TW | 201351637 A | 12/2013 |
| TW | 201442120 A | 11/2014 |

*Primary Examiner* — Kevin M Picardat
(74) *Attorney, Agent, or Firm* — Birch, Stewart, Kolasch & Birch, LLP

(57) ABSTRACT

High-voltage semiconductor devices are provided. The high-voltage semiconductor device includes a substrate and an isolation structure in the substrate. The high-voltage semiconductor device includes a gate structure disposed on the substrate, wherein the gate structure is separated from the isolation structure by a distance. The high-voltage semiconductor device also includes a metal electrode disposed on the gate structure, wherein the metal electrode extends to directly above the isolation structure. The high-voltage semiconductor device further includes an interconnection structure including the lowest metal layer, wherein the metal electrode is between the lowest metal layer and the gate structure. Methods of manufacturing the high-voltage semiconductor device are also provided.

18 Claims, 4 Drawing Sheets

(56) References Cited

U.S. PATENT DOCUMENTS

| | | | |
|---|---|---|---|
| 2002/0079521 A1* | 6/2002 | Lin | H01L 29/402 257/288 |
| 2004/0021175 A1* | 2/2004 | Brech | H01L 29/7835 257/340 |
| 2008/0308862 A1* | 12/2008 | Theeuwen | H01L 29/402 257/328 |
| 2009/0020811 A1 | 1/2009 | Voldman | |
| 2010/0314666 A1* | 12/2010 | Saito | H01L 29/0619 257/201 |
| 2011/0303976 A1* | 12/2011 | Kocon | H01L 29/861 257/337 |
| 2012/0228704 A1 | 9/2012 | Ju | |
| 2013/0153888 A1* | 6/2013 | Inoue | H01L 29/66477 257/43 |
| 2013/0292699 A1* | 11/2013 | Ueno | H01L 29/778 257/76 |
| 2015/0028390 A1* | 1/2015 | Colino | H01L 29/7786 257/194 |

* cited by examiner

HIGH-VOLTAGE SEMICONDUCTOR DEVICE AND METHOD OF MANUFACTURING THE SAME

BACKGROUND OF THE INVENTION

Field of the Invention

The present invention relates to a semiconductor device and a method of manufacturing the same, and in particular to a high-voltage semiconductor device and a method of manufacturing the same.

Description of the Related Art

The technology used in high-voltage semiconductor devices is applicable to integrated circuits with high voltage and high power. Conventional high-voltage semiconductor devices, such as vertically diffused metal oxide semiconductor (VDMOS) transistors and laterally diffused metal oxide semiconductor (LDMOS) transistors, are used in field of device with above 18V. The advantage of high-voltage semiconductor devices is that they meet cost requirements and are compatible with other processes. High-voltage semiconductor devices are extensively used in display driver ICs, power supplies, power management, communication, automotive electronics, and industrial control.

High-voltage semiconductor devices generate a channel by a gate voltage, and then control the current transmission between source and drain. Conventional high-voltage semiconductor devices increase the length of the channel of transistor for preventing the punch-through effect between source and drain. However, it increases the size of devices such that the area of chips also increases, and the on-resistance ($R_{on}$) of the transistor is also increased. Furthermore, due to the mobility of hole being lower than that of the electron, $R_{on}$ of P-type high-voltage semiconductor devices are greater than that of N-type high-voltage semiconductor devices, and it's unfavorable for improving the performance of P-type high-voltage semiconductor devices.

Therefore, it is necessary to find a new high-voltage semiconductor device structure to solve the above problems.

BRIEF SUMMARY OF THE INVENTION

The disclosure provides a high-voltage semiconductor device. The high-voltage semiconductor device includes a substrate and an isolation structure in the substrate. The high-voltage semiconductor device includes a gate structure disposed on the substrate, wherein the gate structure is separated from the isolation structure by a distance. The high-voltage semiconductor device also includes a metal electrode disposed on the gate structure, wherein the metal electrode extends to directly above the isolation structure. The high-voltage semiconductor device further includes an interconnection structure including the lowest metal layer, wherein the metal electrode is between the lowest metal layer and the gate structure.

The disclosure provides a high-voltage semiconductor device. The high-voltage semiconductor device includes a substrate including an isolation structure. The high-voltage semiconductor device includes a gate structure disposed on the substrate, wherein the gate structure is separated from the isolation structure by a distance. The high-voltage semiconductor device also includes a source region and a drain region disposed in the substrate, and located at a side of the gate structure and a side of the isolation structure far from the gate structure, respectively. The high-voltage semiconductor device includes an insulating layer disposed on the gate structure. The high-voltage semiconductor device further includes a metal electrode disposed on the insulating layer, and extending to directly above the isolation structure, wherein a portion of the gate structure is covered by the metal electrode, and the source region and the drain region are electrically isolated from the metal electrode.

The disclosure provides a method for manufacturing a high-voltage semiconductor device. The method includes providing a substrate and forming an isolation structure in the substrate. The method includes forming a gate structure on the substrate, wherein the gate structure is separated from the isolation structure by a distance. The method also includes forming a metal electrode on the gate structure, wherein the metal electrode extends from the gate structure to directly above the isolation structure. The method further includes forming the lowest metal layer of an interconnection structure, wherein the metal electrode is between the lowest metal layer and the gate structure.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
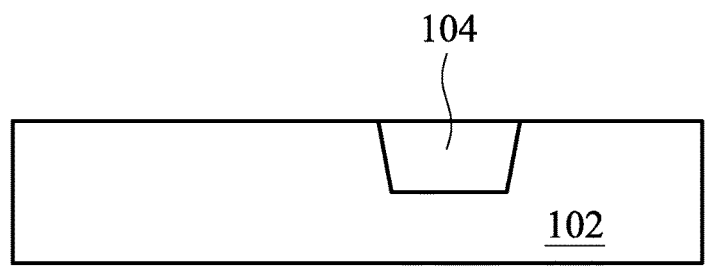
FIGS. 1-7 are cross-sectional representations of various stages for forming a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer directly contacts the other layer, or that the layer does not directly contact the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value. The stated value of the present disclosure is an approximate value. When there is no specific description, the stated value includes the meaning of "about" or "substantially".

It should also be noted that the present disclosure presents embodiments of a high-voltage semiconductor device, and may be included in an integrated circuit (IC) such as a microprocessor, memory device, and/or other device. The IC may also include various passive and active microelectronic devices, such as thin film resistors, other capacitor (e.g. metal-insulator-metal capacitor, MIMCAP), inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, or other types of transistors. One of ordinary skill may recognize that the high-voltage semiconductor devices may be used in other type of semiconductor elements.

Referring to FIG. 1, a substrate 102 is provided first. The substrate 102 may include, but is not limited to, semiconductor substrate such as a silicon substrate. In addition, the substrate 102 may include an element semiconductor which may include germanium; compound semiconductor which may include silicon carbide, gallium arsenide, gallium phosphide, indium phosphide, indium arsenide and/or indium antimonide; alloy semiconductor which may include SiGe alloy, GaAsP alloy, AlInAs alloy, AlGaAs alloy, GaInAs alloy, GaInP alloy and/or GaInAsP alloy, or a combination thereof. In addition, the substrate 102 may include semiconductor-on-insulator. In addition, the substrate 102 may include an epitaxial layer (not shown). The epitaxial layer may include, but is not limited to, Si, Ge, SiGe, III-V compound, or a combination thereof. The epitaxial layer may be formed by an epitaxial growth step, such as metal-organic chemical vapor deposition (MOCVD), metal-organic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapour phase epitaxy (Cl-VPE), or any other suitable methods. In some embodiments, the substrate 102 has a first conductive type such as N-type.

In addition, as shown in FIG. 1, the substrate 102 also includes a isolation structure 104 formed therein. The isolation structure 104 includes different structures formed by using different processing technologies. For example, the isolation structure 104 may include shallow trench isolation (STI) structures. The formation of an STI may include etching a trench in the substrate 102 and filling in the trench with insulator materials such as silicon oxide, silicon nitride, silicon oxynitride or a combination thereof. The filled trench may have a multi-layer structure such as a thermal oxide liner layer with silicon nitride filling the trench. A chemical mechanical polishing (CMP) process may be performed to polish back excessive insulator materials and planarize the top surface of the isolation structure 104. However, the isolation structure 104 may be formed by any other suitable method. For example, the isolation structure 104 may be formed by a local-oxidation of silicon (LOCOS).

Figure 2:
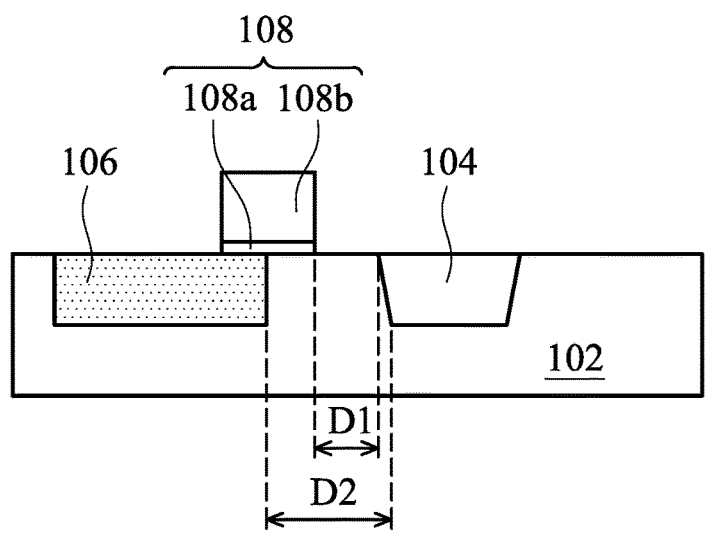

Next, as shown in FIG. 2, a gate structure 108 is formed on the substrate 102, and a first doped region 106 is formed in the substrate 102. The gate structure 108 includes a gate dielectric layer 108a and a gate electrode 108b formed above the gate dielectric layer 108a. In addition, the first doped region 106 is formed before subsequently formed drain region.

In some embodiments, a dielectric material layer (not shown, for forming the gate dielectric layer 108a) and a conductive material layer (not shown, for forming the gate electrode 108b) thereon may be blanketly deposited over the substrate 102 sequentially. Then the predetermined region of the substrate 102 for forming the first doped region 106 is exposed from the dielectric material layer and the conductive material layer through photolithography and etching process. Next, the first doped region 106 is formed by performing ion implantation. Subsequently, the gate dielectric layer 108a and the gate electrode 108b are respectively formed from the dielectric material layer and the conductive material layer by patterning the above two layers through another photolithography and etching process.

The material of the dielectric material layer (i.e. the material of the gate dielectric layer 108a) may include, but is not limited to, silicon oxide, silicon nitride, silicon oxynitride, high-k dielectric material, any other suitable dielectric material, or a combination thereof. The high-k dielectric material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k dielectric material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, $(Ba,Sr)TiO_3$ (BST), $Al_2O_3$, any other suitable high-k dielectric material, or a combination thereof. The dielectric material layer may be formed by the previously described chemical vapor deposition or spin-on coating.

The material of the conductive material layer (i.e. the material of the gate electrode 108b) may include, but is not limited to, amorphous silicon, poly-silicon, one or more metal, metal nitride, conductive metal oxide, or a combination thereof. The metal may include, but is not limited to, molybdenum, tungsten, titanium, tantalum, platinum, or hafnium. The metal nitride may include, but is not limited to, molybdenum nitride, tungsten nitride, titanium nitride or tantalum nitride. The conductive metal oxide may include, but is not limited to, ruthenium oxide or indium tin oxide. The conductive material layer may be formed by the previous described chemical vapor deposition (CVD), sputtering, resistive thermal evaporation, electron beam evaporation, or any other suitable methods. For example, in one embodiment, the amorphous silicon conductive material layer or poly-silicon conductive material layer may be deposited and formed by low-pressure chemical vapor deposition at about 525° C.-650° C. The thickness of the amorphous silicon conductive material layer or poly-silicon conductive material layer may range from about 1000 Å to 10000 Å. In some embodiments, the gate electrode 108b may be polysilicon layers.

In some embodiments, the first doped region 106 has a second conductive type different from the first conductive type of the substrate 102. For example, when the substrate 102 is N-type, then the first doped region 106 is P-type.

Furthermore, as shown in FIG. 2, in some embodiments, the gate structure 108 is separated from the isolation structure 104 by a first distance D1, and the first doped region 106 is separated from the isolation structure 104 by a second distance D2. In this embodiment, the gate structure 108 doesn't overlap with the isolation structure 104. The first distance D1 is a distance between the gate structure 108 and the edge of the isolation structure 104 in a direction parallel with the surface of the substrate 102. The first distance D2 is a distance between the first doped region 106 and the edge of the isolation structure 104 in a direction parallel with the surface of the substrate 102.

Figure 3:
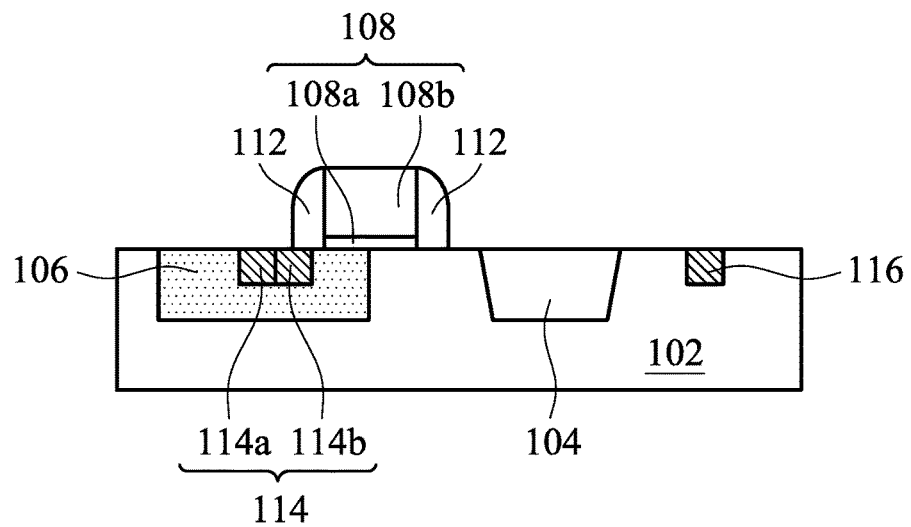

Next, referring to FIG. 3, an insulating sidewall layer 112 is formed over the sidewall of the gate structure 108. In some embodiments, an insulating layer, for example silicon oxide or silicon nitride, with a thickness ranging from about 200 Å to 2000 Å may be deposited by low-pressure chemical vapor deposition or plasma-enhanced chemical vapor deposition at about 350° C.-850° C. Alternatively, when the insulating sidewall layer 112 is a composite sidewall layer, more than one insulating layer may be deposited. After the deposition, $SF_6$, $CF_4$, $CHF_3$ or $C_2F_6$ is used as an etchant and anisotropic etching is performed by a reactive ion etching step to form the insulating sidewall layer 112 over the sidewalls of the gate structure 108.

Still referring to FIG. 3, after the insulating sidewall layer 112 is formed, a source region 114 and a drain region 116 are formed in the substrate 102. The source region 114 and the drain region 116 are located at a side of the gate structure 108 and a side of the isolation structure 104 far from the gate structure 108, respectively. Specifically, the source region 114 is disposed in the first doped region 106, and the drain region 116 is disposed in the region of the substrate 102 where no first doped region 106 is formed. The source region 114 and the drain region 116 may be formed by ion implantation. In addition, the source region 114 may include a second doped region 114*a* having first conductive type (e.g. N-type) and a third doped region 114*b* having second conductive type (e.g. P-type). The drain region 116 has first conductive type (e.g. N-type). In addition, as shown in FIG. 3, a portion of the third doped region 114*b* is directly under the insulating sidewall layer 112.

Figure 4:
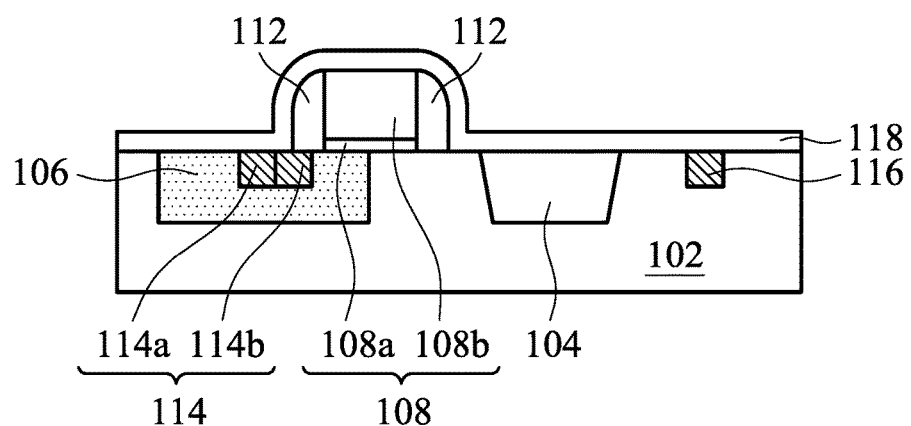

Next, as shown in FIG. 4, in some embodiments, an insulating layer 118 is formed on the substrate 102, and the gate structure 108 and the insulating sidewall layer 112 are covered by the insulating layer 118. The insulating layer 118 is made of silicon nitride, silicon oxynitride, silicon carbide, silicon oxide, silicon carbon nitride, another suitable material, or a combination thereof. The insulating layer 118 may be formed by deposition process, the deposition process includes CVD, PVD, atomic layer deposition (ALD), high-density plasma CVD (HDPCVD), metal organic CVD (MOCVD), remote plasma CVD (RPCVD), plasma-enhanced CVD (PECVD), plating, another suitable process, or a combination thereof.

In addition, the insulating layer 118 may include a blocking layer (not shown). The blocking layer is used to cover the portion of the gate structure 108 where the formation of metal silicide is undesired. Therefore, the portion of the gate structure 108 covered by the blocking layer will not contact metal to form metal silicide in the subsequent metal silicidation process. The material of the blocking layer may include, but is not limited to, silicon oxide, silicon nitride, silicon oxynitride formed by chemical vapor deposition (CVD), any other suitable insulating materials, or a combination thereof.

Figure 5:
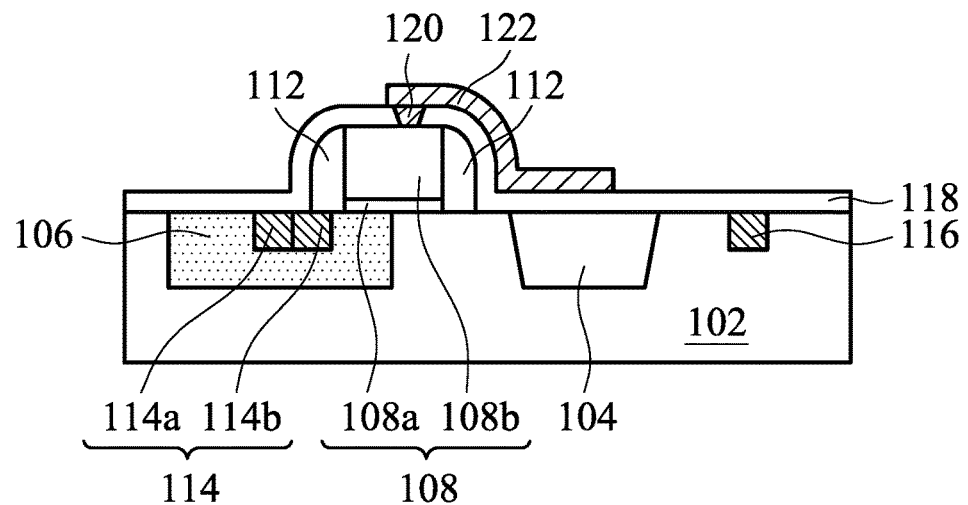

Next, as shown in FIG. 5, in some embodiments, a first contact 120 is formed on the gate structure 108 and penetrates through the insulating layer 118, and a metal electrode 122 is formed on the insulating layer 118. An etching process is performed to form an opening (not shown) in the insulating layer 118 so that a portion of the gate electrode 108*b* of the gate structure 108 is exposed. Next, a metal layer (not shown) is deposited on the insulating layer 118 and filled into the opening by a deposition process to form the first contact 120. Next, an etching process is performed to patternize the metal layer, and the metal electrode 122 is formed. In some embodiments, the materials of the first contact 120 and the metal electrode 122 include electrically conductive material, such as aluminum (Al), copper (Cu), tungsten (W), titanium (Ti), tantalum (Ta), titanium nitride (TiN), tantalum nitride (TaN), nickel silicide (NiSi), cobalt silicide (CoSi), tantalum carbide (TaC), tantalum silicide nitride (TaSiN), tantalum carbide nitride (TaCN), titanium aluminide (TiAl), titanium aluminium nitride (TiAlN), metal oxide, metal alloy, other applicable conductive materials, or a combination thereof.

As shown in FIG. 5, the metal electrode 122 is electrically connected to the gate structure 108 by the first contact 120. In some embodiments, a portion of the gate structure 108 is covered by the metal electrode 122, and the metal electrode 122 further extends from above the gate structure 108 to directly above the isolation structure 104. In addition, the insulating sidewall layer 112 at a side of the gate structure 108, a portion of the substrate 102 and the isolation structure 104 are also covered by the metal electrode 122. Namely, the region of the substrate 102 between the gate structure 108 and the isolation structure 104 is covered by the metal electrode 122. In some embodiments, the source region 114 and the drain region 116 are electrically isolated from the metal electrode 122. In other some embodiments, the region of the substrate 102 between the first doped region 106 and the isolation structure 104 overlaps with the projection of the metal electrode 122 on the substrate 102. The metal electrode 122 may further extend onto the first doped region 106, namely, the metal electrode 122 may extend from directly above the first doped region 106 to directly above the isolation structure 104.

Figure 6:
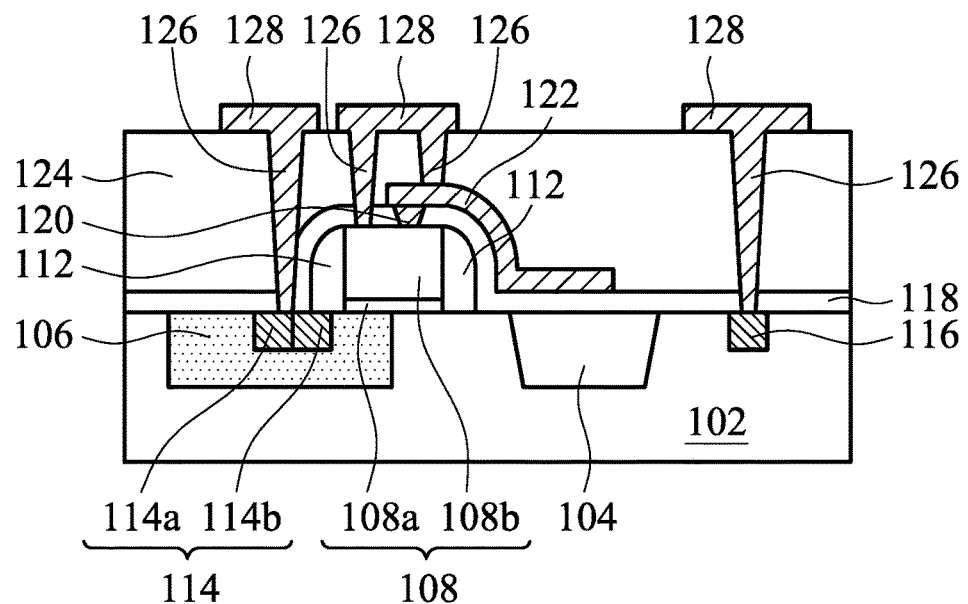

Next, as shown in FIG. 6, a dielectric layer 124 is formed over the substrate 102. The dielectric layer 124 may include multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

Next, an etching process is performed to form a plurality of the openings (not shown) in the dielectric layer 124 such that a portion of the gate electrode 108*b* of the gate structure 108, a portion of the metal electrode 122, a portion of the source region 114 and a portion of the drain region 116 are exposed. Next, a metal layer (not shown) is deposited on the dielectric layer 124 by a deposition process and filled into the openings to form a second contact 126. Next, an etching process is performed to patternize the metal layer, then the lowest metal layer 128 (also called the first metal layer) as a portion of an interconnection structure 140 is formed. The materials of the second contact 126 and the lowest metal layer 128 include electrically conductive material, such as aluminum (Al), copper (Cu), tungsten (W), titanium (Ti), tantulum (Ta), titanium nitride (TiN), tantalum nitride (TaN), nickel silicide (NiSi), cobalt silicide (CoSi), tantulum carbide (TaC), tantulum silicide nitride (TaSiN), tantalum carbide nitride (TaCN), titanium aluminide (TiAl), titanium aluminide nitride (TiAlN), metal oxide, metal alloy, other applicable conductive materials, or a combination thereof.

As shown in FIG. 6, the source region 114, the drain region 116, the gate structure 108 and the metal electrode 122 are electrically connected to the lowest metal layer 128 of the interconnection structure 140 by the second contact 126.

In some embodiments, the opening of the dielectric layer 124 is not formed above the gate structure 108, namely, there is no second contact 126 formed between the gate structure 108 and the lowest metal layer 128. In some embodiments, the metal electrode 122 may further extend onto and cover the top surface of the gate structure 108 completely.

Figure 7:
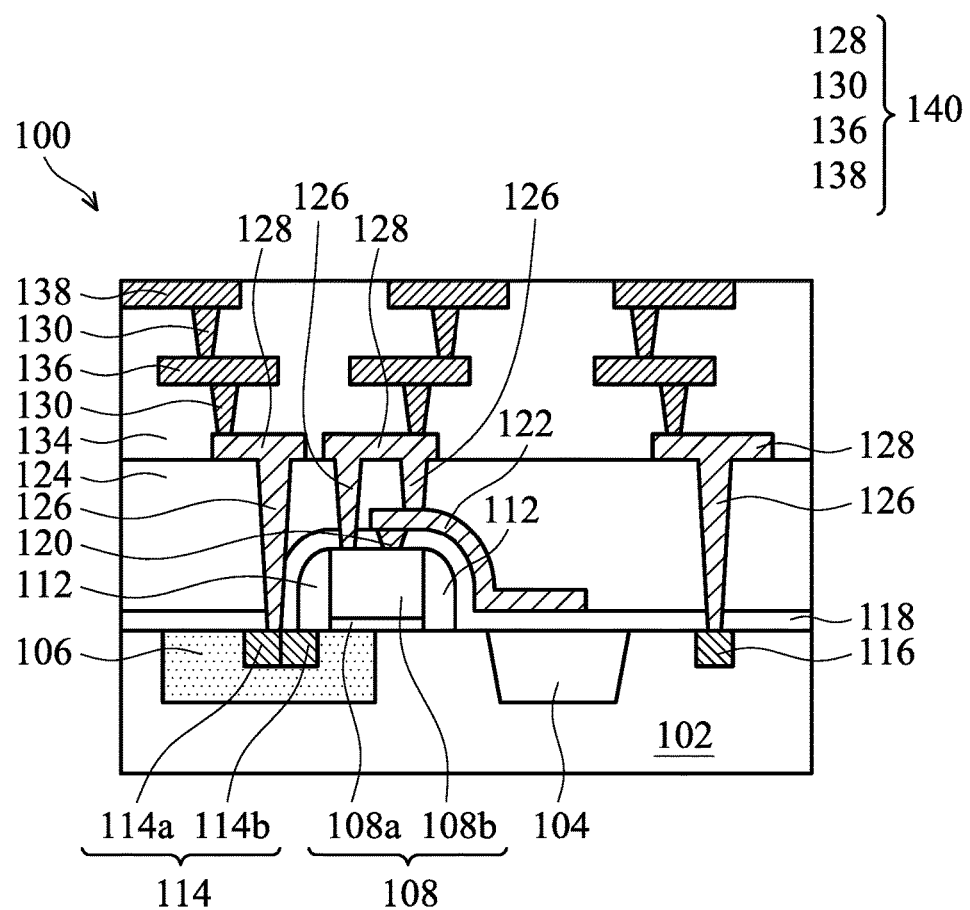

Next, referring to FIG. 7, inter-metal dielectric (IMD) layers 134 are deposited over the dielectric layer 124 and the lowest metal layer 128 of the interconnection structure 140. A photolithography and the etching processes are performed to form a plurality of openings (not shown) in the inter-metal dielectric layer 134. A metal layer (not shown) is deposited on the inter-metal dielectric layer 134 by a deposition process and filled into the openings to form a via 130. Next, an etching process is performed to patternize the metal layer, then a second metal layer 136 and a third metal layer 138 are formed to complete the interconnection structure 140, and the high-voltage semiconductor device 100 is completed. The photolithography processes include photoresist coating (e.g., spin-on coating), soft baking, mask alignment, exposure, post-exposure baking, developing the photoresist, rinsing and drying (e.g., hard baking). The photolithography process is also implemented or replaced by other proper methods such as maskless photolithography, electron-beam writing and ion-beam writing. The etching processes include dry etching, wet etching, or other etching methods.

As shown in FIG. 7, the interconnection structure 140 is composed of the lowest metal layer 128 (which is also called the first metal layer), the second metal layer 136 and the third metal layer 138 and the via 130. However, it should be noted that the number of the vias 130 and the metal layers shown in FIG. 7 is only an example, and the present invention is not limited thereto. Namely, the interconnection structure 140 may further include such as a fourth metal layer (not shown) or more metal layers. The material of the inter-metal dielectric layer 134 may be the same with that of the dielectric layer 124. The materials of the via 130, the second metal layer 136 and the third metal layer 138 may be the same with that of the lowest metal layer 128.

Besides, in some embodiments, the first type may be P-type, and the second type may be N-type.

The embodiments of the present invention provide a high-voltage semiconductor device with a metal electrode which is disposed between the gate structure and the lowest metal layer of the interconnection structure, and the metal electrode extends from the gate electrode to directly above the isolation structure. In some embodiments, the gate electrode is a polysilicon layer. At this time, a metal-insulator-polysilicon (MIP) structure is consisted of the polysilicon layer, the metal electrode and the insulating layer which is between the polysilicon layer and the metal electrode. It generates an effect of lateral field plate when the metal electrode extends to directly above the isolation structure, and helps the charge balance of the junction field-effect transistor (JFET) region (namely, the region of the substrate 102 between the first doped region 106 and the isolation structure 104). Therefore, the high-voltage semiconductor device doesn't breakdown due to short length of JFET region (namely, the distance D2 between the first doped region 106 and the isolation structure 104).

Since conventional high-voltage semiconductor devices seek better value of breakdown voltage and are limited by charge balance, the length of the JFET region can't be too long. However, the length of the JFET region can't be too short for the reliability of the device. The embodiments shown in present invention can increase the length of the JFET region without altering on-resistance ($R_{on}$), thereby improving the reliability of the device and meeting the breakdown voltage value.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A high-voltage semiconductor device, comprising:
a substrate;
an isolation structure in the substrate;
a gate structure disposed on the substrate, wherein the gate structure is separated from the isolation structure by a distance;
a metal electrode disposed on the gate structure, wherein the metal electrode extends to directly above the isolation structure;
an insulating layer disposed on the substrate, and between the metal electrode and the gate structure, wherein the insulating layer extends onto a top surface of the substrate to completely cover the isolation structure; and
an interconnection structure comprising a lowest metal layer, wherein the metal electrode is between the lowest metal layer and the gate structure.

2. The high-voltage semiconductor device as claimed in claim 1, further comprising:
a first contact between the metal electrode and the gate structure, wherein the gate structure is electrically connected to the metal electrode by the first contact.

3. The high-voltage semiconductor device as claimed in claim 2, further comprising:
a second contact between the metal electrode and the lowest metal layer, wherein the metal electrode is electrically connected to the lowest metal layer by the second contact.

4. The high-voltage semiconductor device as claimed in claim 1, further comprising:
a first doped region in the substrate, wherein the substrate has a first conductive type, and the first doped region has a second conductive type different from the first conductive type.

5. The high-voltage semiconductor device as claimed in claim 4, further comprising:

a source region and a drain region, wherein the source region is disposed in the first doped region, and the drain region is disposed in the substrate.

6. The high-voltage semiconductor device as claimed in claim 4, wherein a region of the substrate between the first doped region and the isolation structure is covered by the metal electrode.

7. The high-voltage semiconductor device as claimed in claim 5, wherein the source region and the drain region are disposed in two opposite sides of the isolation structure.

8. The high-voltage semiconductor device as claimed in claim 5, wherein the source region and the drain region are electrically isolated from the metal electrode.

9. The high-voltage semiconductor device as claimed in claim 1, wherein a region of the substrate between the gate structure and the isolation structure is covered by the metal electrode.

10. The high-voltage semiconductor device as claimed in claim 1, wherein the gate structure comprises a polysilicon layer.

11. A high-voltage semiconductor device, comprising:
   a substrate comprising an isolation structure;
   a gate structure disposed on the substrate, wherein the gate structure is separated from the isolation structure by a distance;
   a source region and a drain region disposed in the substrate, and located at a side of the gate structure and a side of the isolation structure far from the gate structure, respectively;
   an insulating layer disposed on the gate structure, wherein the insulating layer extends onto a top surface of the substrate to completely cover the isolation structure; and
   a metal electrode disposed on the insulating layer, and extending to directly above the isolation structure, wherein a portion of the gate structure is covered by the metal electrode, and the source region and the drain region are electrically isolated from the metal electrode.

12. The high-voltage semiconductor device as claimed in claim 11, wherein the gate structure comprises a polysilicon layer.

13. The high-voltage semiconductor device as claimed in claim 11, wherein a top surface of the gate structure is covered by the metal electrode.

14. The high-voltage semiconductor device as claimed in claim 11, further comprising:

a contact disposed between the metal electrode and the gate structure, and penetrating through the insulating layer, wherein the gate structure is electrically connected to the metal electrode by the contact.

15. A method for forming a high-voltage semiconductor device, comprising:
   providing a substrate;
   forming an isolation structure in the substrate;
   forming a gate structure on the substrate, wherein the gate structure is separated from the isolation structure by a distance;
   forming a metal electrode on the gate structure, wherein the metal electrode extends from the gate structure to directly above the isolation structure;
   forming an insulating layer on the substrate and between the metal electrode and the gate structure, wherein the insulating layer extends onto a top surface of the substrate to completely cover the isolation structure; and
   forming the lowest metal layer of an interconnection structure, wherein the metal electrode is between the lowest metal layer and the gate structure.

16. The method as claimed in claim 15, wherein the forming the gate structure comprises forming a polysilicon layer.

17. The method as claimed in claim 15, further comprising:
   forming a first contact between the metal electrode and the gate structure, wherein the gate structure is electrically connected to the metal electrode by the first contact.

18. The method as claimed in claim 17, further comprising:
   forming a source region and a drain region in the substrate, wherein the source region and the drain region are at a side of the gate structure and at a side of the isolation structure far from the gate structure respectively, and the source region and the drain region are electrically isolated from the metal electrode; and
   forming a second contact on the substrate, the gate structure and the metal electrode, wherein the source region, the drain region, the gate structure and the metal electrode are electrically connected to the lowest metal layer by the second contact.

* * * * *